US008437148B2

(12) United States Patent
Hsu et al.

(10) Patent No.: US 8,437,148 B2
(45) Date of Patent: May 7, 2013

(54) DISPLAY DEVICE WITH PANEL POSITIONING STRUCTURE AND METHOD FOR MANUFACTURING THE SAME

(75) Inventors: Shih-Chieh Hsu, Hsin-Chu (TW); Benhon Chen, Hsin-Chu (TW)

(73) Assignee: AU Optronics Corporation, Hsin-Chu (TW)

( * ) Notice: Subject to any disclaimer, the term of this patent is extended or adjusted under 35 U.S.C. 154(b) by 311 days.

(21) Appl. No.: 12/825,395

(22) Filed: Jun. 29, 2010

(65) Prior Publication Data

US 2011/0002112 A1   Jan. 6, 2011

(30) Foreign Application Priority Data

Jul. 2, 2009   (TW) ............................... 98122387 A

(51) Int. Cl.
*H05K 7/00* (2006.01)
*G02F 1/1333* (2006.01)

(52) U.S. Cl.
USPC ............................... 361/829; 349/58; 349/60

(58) Field of Classification Search ............... 361/679.3, 361/679.12, 679.55, 679.56, 829; 348/58, 348/60
See application file for complete search history.

(56) References Cited

U.S. PATENT DOCUMENTS

| | | | |
|---|---|---|---|
| 5,929,950 A * | 7/1999 | Matsuda | 349/60 |
| 6,909,475 B2 * | 6/2005 | Kojima et al. | 349/58 |
| 7,304,837 B2 | 12/2007 | Lo et al. | |
| 7,599,016 B2 * | 10/2009 | Lo et al. | 349/56 |
| 7,697,275 B2 * | 4/2010 | Chen et al. | 361/679.3 |
| 8,068,331 B2 * | 11/2011 | Sauers et al. | 361/679.01 |
| 2008/0049162 A1 | 2/2008 | Shen et al. | |
| 2009/0291709 A1 * | 11/2009 | Lee et al. | 455/556.2 |

FOREIGN PATENT DOCUMENTS

| | | |
|---|---|---|
| CN | 200983049 Y | 11/2007 |
| JP | 10022665 A | 1/1998 |
| JP | 2003131198 A | 5/2003 |
| TW | 257503 B | 7/2006 |

OTHER PUBLICATIONS

Chinese Language Office Action issued Jun. 11, 2010.
English translation of abstract of CN200983049(Y).
English translation of abstract of TW257503(B).
English translation of abstract of JP10022665(A).
English translation of abstract of JP2003131198(A).

* cited by examiner

*Primary Examiner* — Angel R Estrada
*Assistant Examiner* — Dimary Lopez
(74) *Attorney, Agent, or Firm* — McClure, Qualey & Rodack, LLP

(57) ABSTRACT

A panel display and a method for manufacturing the same are provided. The panel display includes a frame, an elastic pad, and a display panel. The frame has a supporting tray and a side wall which perpendicularly extends from the end of the supporting tray. A groove is formed on the supporting tray adjacent to the foot of the side wall. One end of the elastic pad is located within the groove while the other end leans on the side wall before the display panel is configured with the frame. When entering the display panel into the frame, the edge of the display panel compels the elastic pad to bend and form a bottom portion and a side portion. The bottom portion is accommodated in the groove while the side portion is compressed by the edge of the display panel and lies on the side wall.

11 Claims, 7 Drawing Sheets

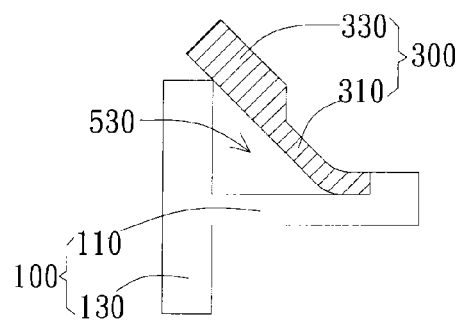
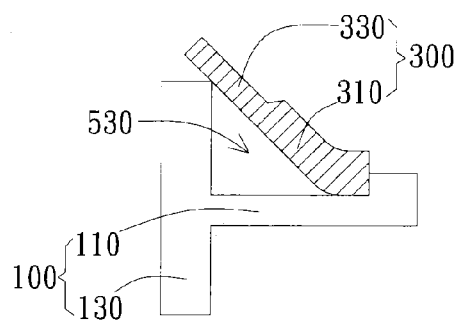
FIG. 6A  FIG. 6B
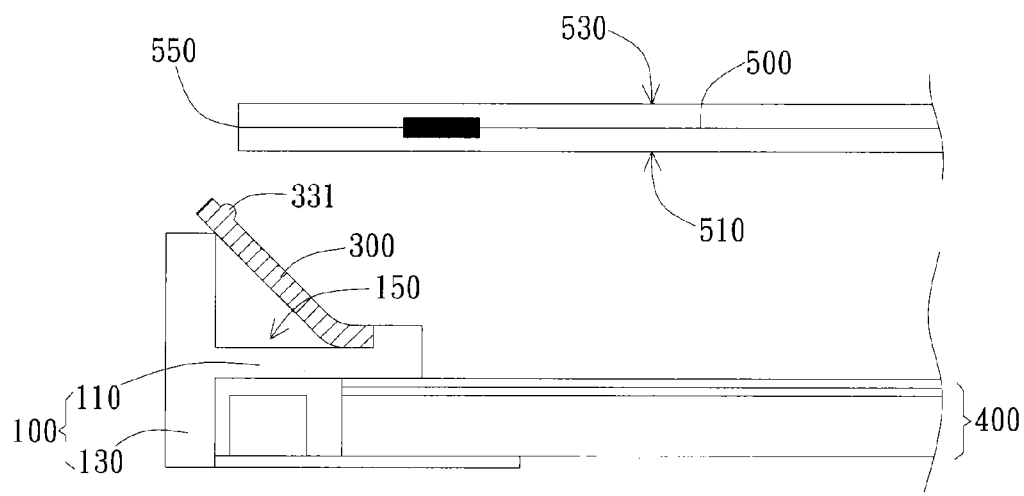
FIG. 7A
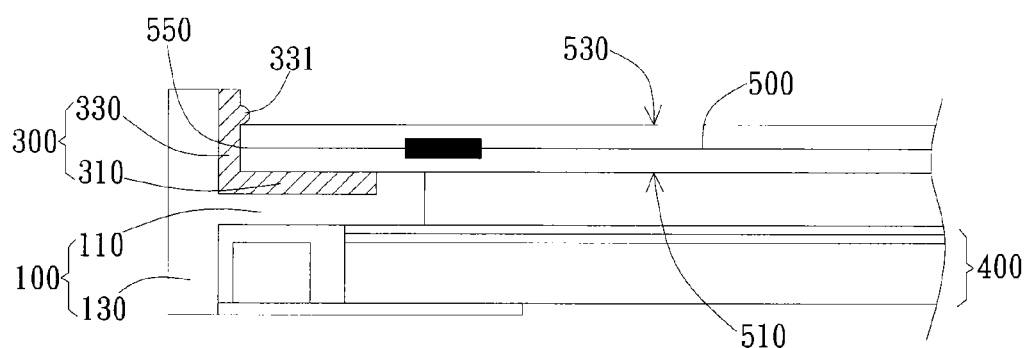
FIG. 7B

DISPLAY DEVICE WITH PANEL POSITIONING STRUCTURE AND METHOD FOR MANUFACTURING THE SAME

This application claims priority based on a Taiwanese Patent Application No. 098122387 filed on Jul. 2, 2009.

BACKGROUND OF THE INVENTION

1. Field of the Invention

The present invention relates to a display device and a method for manufacturing the same. In particularity, the present invention relates to a display device capable of effectively positioning a display panel relative to a frame and a method for manufacturing the same.

2. Description of the Prior Art

Since display panel devices have advantages such as thinness, light weight, and portability, the demand for display panel devices increases rapidly. As the technologies advance, higher requirements for design and assembly quality of the display panel device are made. In order to improve the life-span and the yield of the product, the design of the display panel device requires continuous improvements.

FIG. 1 illustrates a schematic view of a conventional panel display device. The conventional panel display device includes a front frame 10, a liquid crystal display (LCD) panel 20, an outer frame 30, and a backlight module 50. The outer frame 30 includes a side wall 31 and a support portion 33, wherein the support portion 33 extends from the side wall 31 toward the center of the outer frame 30. The LCD panel 20 is disposed on the outer frame 30 and supported by the support portion 33 while the side wall 31 surrounds around the side of the LCD panel 20. The backlight module 50 is disposed under the outer frame 30 and the LCD panel 20 and emits lights toward the rear side of the LCD panel 20. The front frame 10 covers the edge of the LCD panel 20 from the display side of the LCD 20 and the outer side of the outer frame 30 as well.

In the conventional design, the outer frame 30 is generally formed of thermosetting plastic materials to provide better support. In addiction, in order to avoid the assembly problem caused by the production tolerance, a gap usually exits between the side wall 31 of the outer frame 30 and the LCD panel 20. Since the friction generated between the outer frame 30 and the LCD panel 20 is not sufficient, the LCD penal 20 may slide on the outer frame 30 and collide with the outer frame 30 to cause damage.

SUMMARY OF THE INVENTION

It is an object of the present invention to provide a display device capable of effectively positioning the display panel with respect to the frame.

It is another object of the present invention to provide a display device which reduces the possibility of damaging the display panel.

It is yet another object of the present invention to provide a method for manufacturing a display device, which prevents the display panel from being damaged.

The display device includes a frame, an elastic pad, and a display panel. The display panel is disposed on the frame and supported by the frame. The elastic pad is sandwiched between the display panel and the frame and configured to position the display panel with respect to the frame. The frame has a supporting tray and a side wall which is connected to the supporting tray and upwardly extends from the end of the supporting tray. The supporting tray and the side wall together form an open accommodating space. A groove is formed on the supporting tray adjacent to the foot of the side wall.

The elastic pad has an elastic modulus greater than that of the frame, so that the elastic pad is susceptible to deformation under force. Before the display panel is disposed on the frame and the elastic pad, one end of the elastic pad is located within the groove while the other end leans on the side wall. When the display panel is placed on the frame, the edge of the display panel presses the middle portion of the elastic pad and compels the elastic pad to bend and form a bottom portion and a side portion. The bottom portion is accommodated in the groove while the side portion is compressed by the edge of the display panel and is attached to the inner surface of the side wall. Since a normal force is generated when the display panel presses the side portion, a frictional force is generated between the display panel and the side portion. Therefore, the display panel is not susceptible to move relative to the frame and the positioning effect is achieved.

The method of manufacturing a display device includes the following steps: forming a frame in a manner that the frame has a supporting tray and a side wall, and the supporting tray and the side wall together enclose an accommodating space; forming a groove in the supporting tray adjacent to the side wall; disposing an elastic pad in a manner that the elastic pad leans on the side wall and one end of the elastic pad is connected to a bottom of the groove; and disposing a display panel into the accommodating space in a manner that a side edge of the display panel presses the elastic pad so that the elastic pad is bent to form a bottom portion and a side portion.

BRIEF DESCRIPTION OF THE DRAWINGS

FIG. 6A illustrates a schematic view of another embodiment of the elastic pad;

FIG. 6B illustrates a schematic view of another embodiment of the elastic pad;

FIG. 7A illustrates a schematic view of an embodiment of a positioning protrusion;

FIG. 7B illustrates a schematic view of FIG. 7A after assembly;

DETAILED DESCRIPTION OF THE PREFERRED EMBODIMENT

The present invention provides a display device and a method for manufacturing the same. In a preferred embodiment, the display device of the present invention is a LCD display device including home television, LCD monitor for desktop computer or laptop computer, LCD screen for mobile phone, digital camera, etc.

Figure 1:
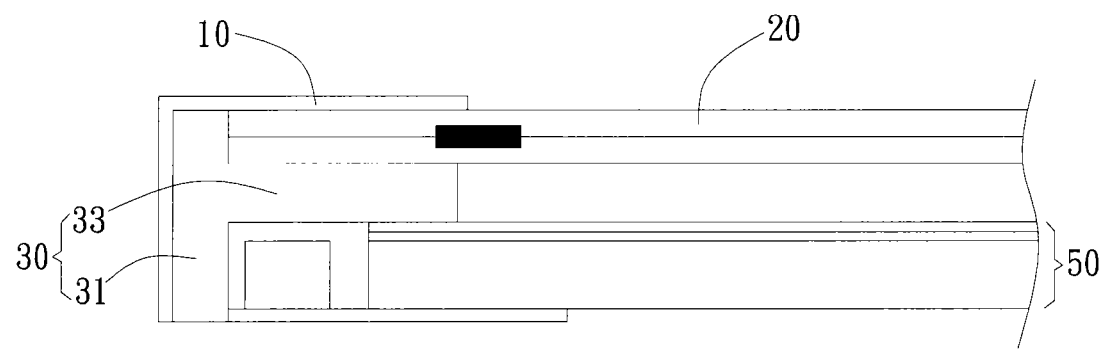
FIG. 1 illustrates a schematic cross-sectional view of a conventional panel display device.
Figure 2:
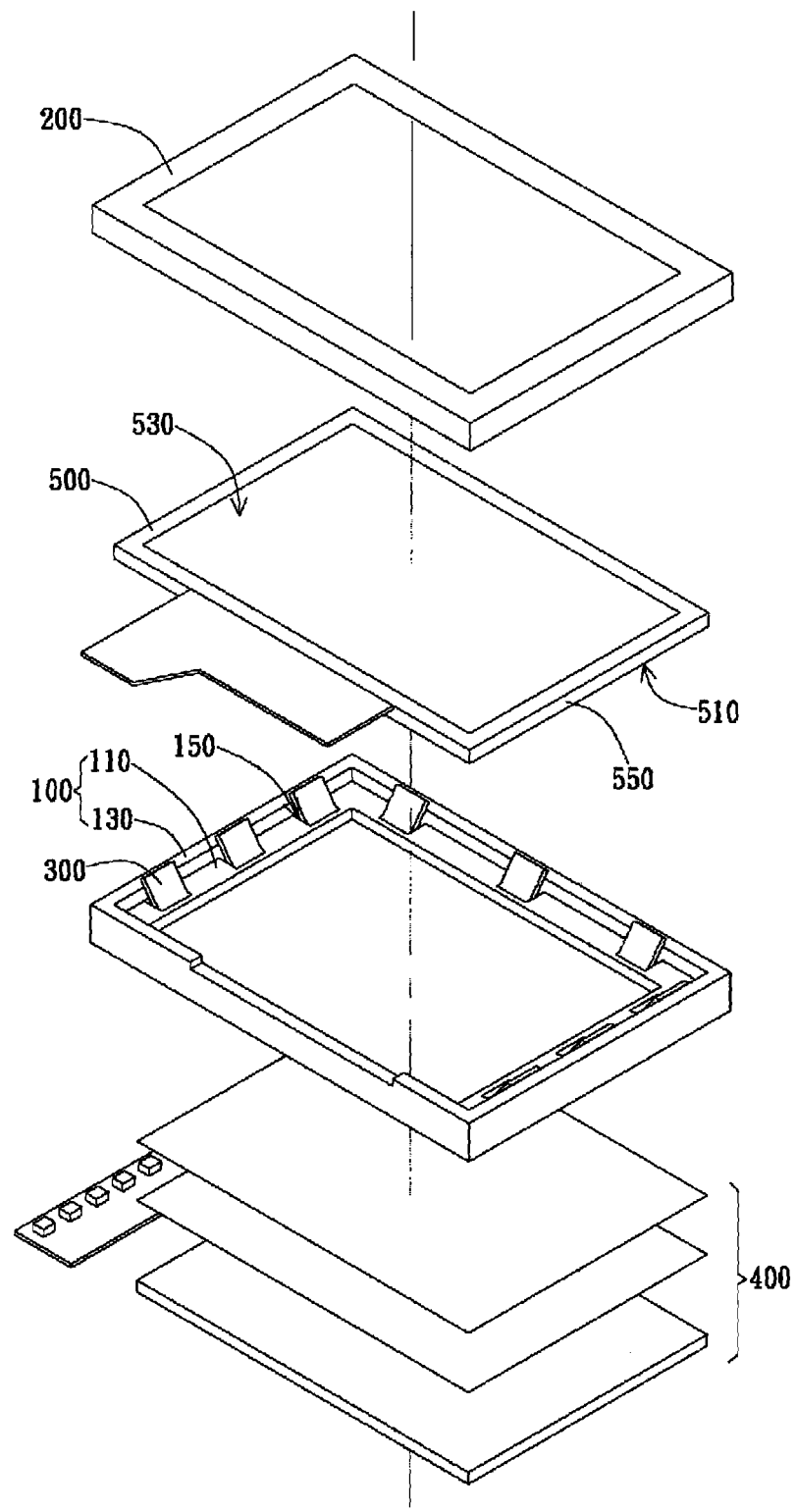
FIG. 2 illustrates an exploded view of a display device of the present invention.

As FIG. 2 shows, the display device includes a frame 100, an elastic pad 300, and a display panel 500. The display panel 500 is disposed on the frame 100 and supported by the frame 100. The elastic pad 300 is sandwiched between the display panel 500 and the frame 100 to position a relative position between the display panel 500 and the frame 100. In the embodiment, the display device further includes a front frame 200 and a backlight module 400. As FIG. 2 shows, the front frame 200 covers on the top and the side of the display panel 500 and the frame 100 and exposes a display surface 530 of the display panel 500. The backlight module 400 is preferably also covered by the frame 100, but not limited thereto. The backlight module 400 is disposed under the display panel 500 and emits lights toward a bottom surface 510 of the display panel 500, such that the display panel 500 can display images on the display surface 530 which is opposite to the bottom surface 510. In other embodiments, however, the display device may not be disposed with the backlight module 400 but adopts the front incident light method. In this case, the display panel 500 is preferably implemented with a display panel eliminating the backlight module 400, such as a reflective liquid crystal panel or an electrophoretic display panel, etc. In addition to liquid crystal panel and electrophoretic display panel, the display panel 500 may be an organic light-emitting diode panel or other suitable panels.

Figure 3:
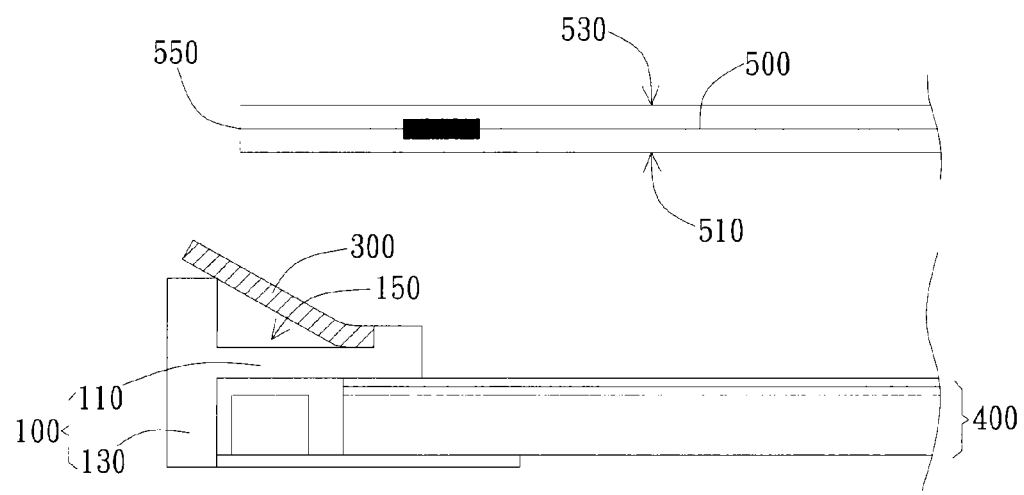
FIG. 3 illustrates a cross-sectional view of the display device before assembly.

As FIG. 2 and FIG. 3 show, the frame 100 has a supporting tray 110 and a side wall 130. The side wall 130 is connected to the edge of the supporting tray 110 and extends upwardly, i.e., extends toward the direction of the front frame 200. The portion of the side wall 130 which extends upwardly may cover the side face of the display panel 500. As FIG. 3 shows, the supporting tray 110 and the side wall 130 together enclose an open accommodating space. The supporting tray 110 and the side wall 130 are disposed on the bottom and the side of the accommodating space, respectively. In the embodiment, the side wall 130 may also extend downwardly from the edge of the supporting tray 110 to cover the side face of the backlight module 400. As FIG. 2 and FIG. 3 show, a groove 150 is formed in the supporting tray 110 adjacent to the bottom end of the side wall 130. In the embodiment, the side wall 130 serves as an inner side wall of the groove 150 while the groove 150 extends along the side wall 130 to be a rectangular shape, but not limited thereto.

Figure 4:
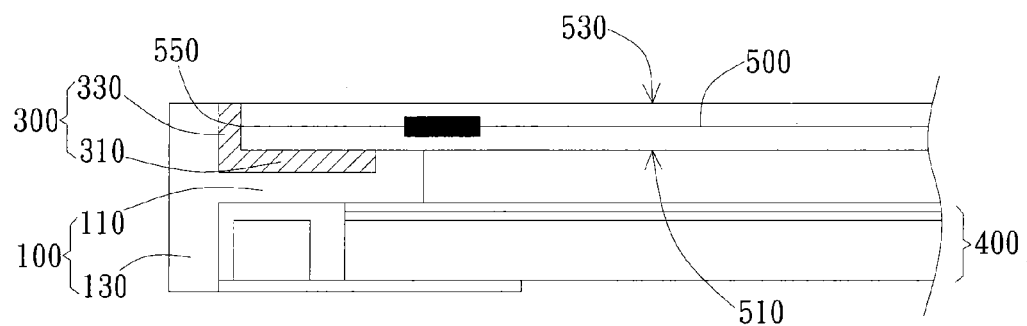
FIG. 4 illustrates a cross-sectional view of FIG. 3 after assembly.

The elastic pad 300 is preferably a rectangular pad which is resilient, and its length is greater than the cross-sectional width of the groove 150, i.e., a distance from the bottom end of the side wall 130 to the other end of the groove 150. The elastic pad 300 has an elastic modulus greater than that of the frame 100. Thus, the elastic pad 300 is susceptible to deformation under force, i.e. is more easily deformed than the frame 100. As FIGS. 2 and 3 show, before the display panel 500 is placed on the frame 100 and the elastic pad 300, the thickness of the elastic pad 300 is preferably greater than the depth of the groove 150. However, when the display panel 500 is placed on the frame 100, as shown in FIG. 4, the thickness of the elastic pad 300 is preferably compressed to be lightly higher than or similar to the depth of the groove 150. Furthermore, the elastic pad 300 is preferably made of rubber. In other embodiments, however, the elastic pad 300 may be made of foams, plastics, or non-plastics.

Before the display panel 500 is placed on the frame 100 and the elastic pad 300, one end of the elastic pad 300 is connected to the groove 150, and the other end leans on the side wall 130.

The elastic pad 300 is preferably a flat elastic pad. However, when the display panel 500 is placed on the frame 100, as FIG. 4 shows, the side edge 550 of the display panel 500 presses the middle portion of the elastic pad 300 downwardly, such that the elastic pad 300 is bent to form a bottom portion 310 and a side portion 330. The bottom portion 310 is accommodated in the groove 150, and the thickness of the bottom portion 310 is preferably compressed to be similar to the depth of the groove 150. In the meantime, the bottom portion 310 and the supporting tray 110 of the frame 110 together support the bottom surface 510 of the display panel 500. In other embodiments, however, the thickness of the bottom portion 310 may be designed to be the same as the depth of the groove 150 when it is not under force and in contact with the bottom surface 510 of the display panel 500. In the embodiment, the friction coefficient of the bottom portion 310 is preferably greater than that of the supporting tray 110, such that a greater static friction between the display panel 500 and the bottom portion 310 can be obtained. Thus, the display panel 500 is not susceptible to move and the positioning effect can be achieved. In addition, a normal force is generated when the display panel 500 presses the bottom portion 310. The normal force also enhances the friction force between the display panel 500 and the bottom portion 310.

Figure 5:
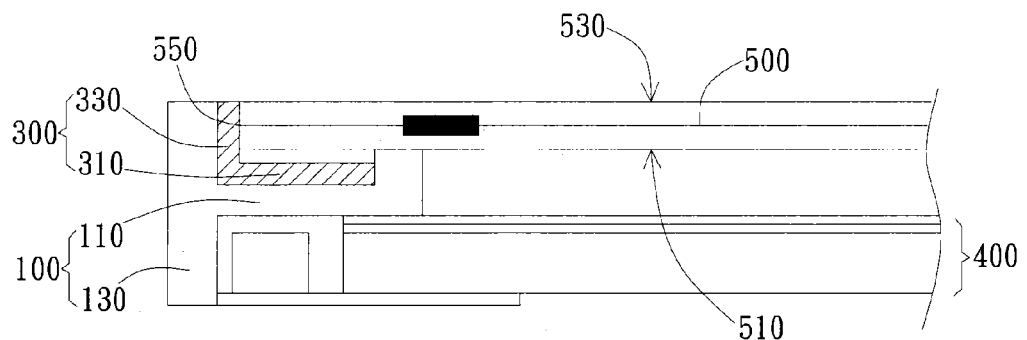
FIG. 5 illustrates a cross-sectional view of the display device using a thinner elastic pad.

As FIG. 4 shows, the side portion 330 pressed by the side edge 550 of the display panel 500 is in contact with an inner surface of the side wall 130. Since the side edge 550 of the display panel 500 corresponds to the side wall 130, the side portion 330 is sandwiched between the side edge 550 of the display panel 500 and the side wall 130. A normal force is generated as the display panel 500 presses the side portion 330, such that a frictional force is generated between the display panel 500 and the side portion 330, and the display panel 500 is accordingly not susceptible to move and the positioning effect can be further enhanced. In the embodiment shown in FIG. 4, the bottom surface 510 of the display panel 500 is in contact with the bottom portion 310 of the elastic pad 300 and the friction is accordingly generated therebetween. In other embodiments, however, as shown in FIG. 5, the design of a thinner elastic pad 300 or a deeper groove 150 may be implemented, such that the bottom surface 510 of the display panel 500 is not in contact with the bottom portion 310. In such a case, the display panel 500 is positioned by the friction between the side edge 550 of the display panel 500 and the side portion 330 of the elastic pad 300.

In the embodiment shown in FIG. 6A and FIG. 6B, the side portion 330 and the bottom portion 310 of the elastic pad 300 may have different thickness for different positioning requirements. As FIG. 6A shows, the thickness of the side portion 330 is greater than that of the bottom portion 310. In such a case, the effect of the side portion 330 positioning the side edge of the display panel 500 and its positioning force can be increased. In the embodiment shown in FIG. 6B, the thickness of the bottom portion 310 is greater than that of the side portion 330. In such a case, the friction between the bottom portion 310 and the bottom surface 510 of the display panel 500 can be increased to enhance the positioning effect.

In the embodiment shown in FIG. 7A and FIG. 7B, a positioning protrusion 331 is formed on the side portion 330 of the elastic pad 300. As FIG. 7A shows, the positioning protrusion 331 is disposed on one side of the side portion 330 which faces toward the display panel 500. When the display panel 500 is assembled with the frame 100, the side edge 550 of the display panel 500 presses the elastic pad 300, such that the side portion 330 is attached to the side edge 550, i.e. the side portion 330 is preferably substantially completely in contact with the side edge 550. In such a case, the positioning protrusion 331 contacts and engages with a top end of the side edge 550 of the display panel 500 to prevent the detachment of the display panel 500 from the frame 100. In the embodiment, the positioning protrusion 331 is preferably formed as a rib and extends along the top end of the side edge 550 of the display panel 500. In other embodiments, however, the positioning protrusion 331 may be a protrusion or a plurality of protrusion structures.

Figure 8A:
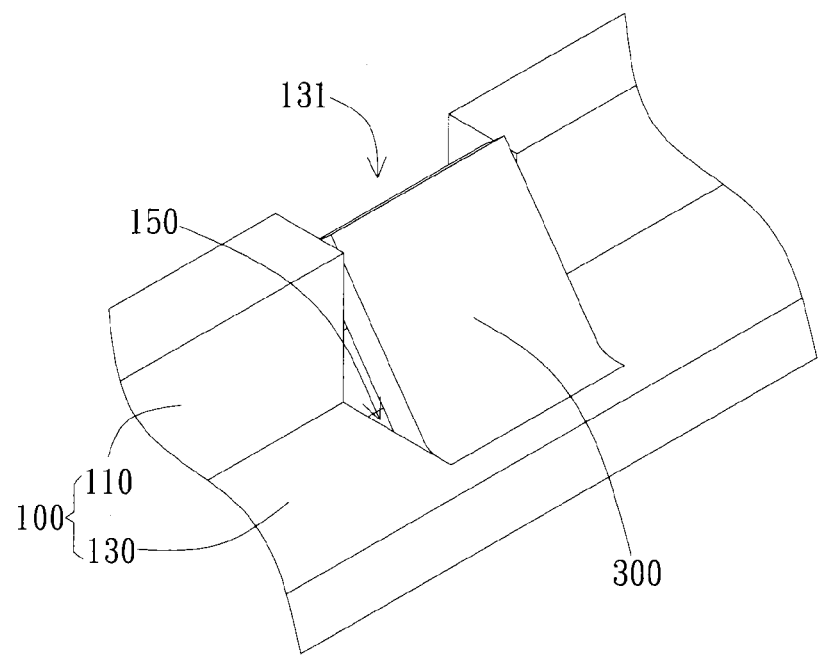
FIG. 8A illustrates a schematic view of an embodiment of a recess disposed on the side wall.
Figure 8B:
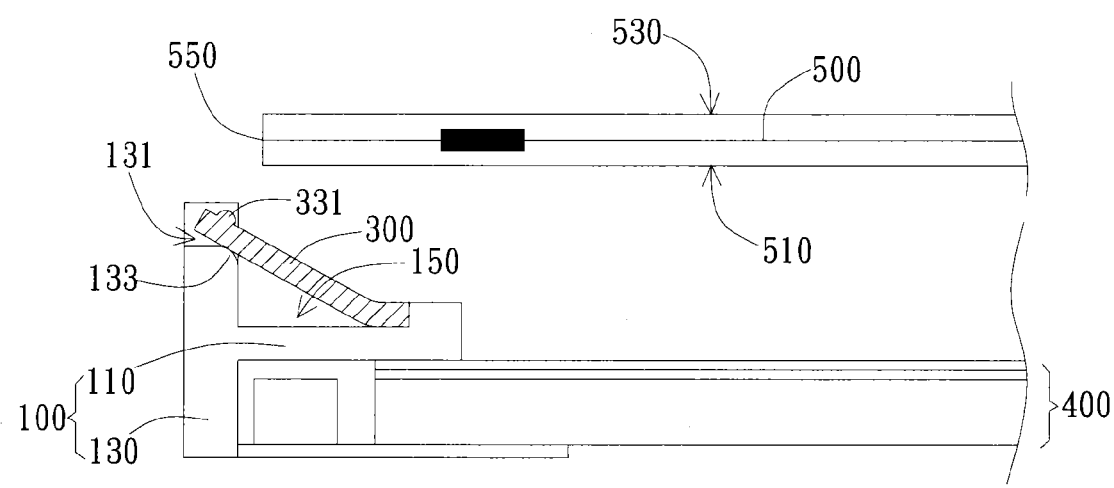
FIG. 8B illustrates a schematic view of an embodiment of a lead angle disposed in the side wall.

In addition, as FIG. 8A shows, a recess 131 is formed in the side wall 130 of the frame 100 corresponding to the elastic pad 300. Moreover, the location of the recess 131 preferably corresponds to the groove 150. When the elastic pad 300 is placed on the frame 100, two sides of the side wall 130 defining the recess 131 can clamp and position the elastic pad 300 therebetween. Furthermore, the depth of the recess 131 can be selected to adjust the tilted angle of the elastic pad 300 when the elastic pad 300 is disposed correspondingly. The recess 131 is preferably recessed from the top end of the side wall 130 toward the direction of the supporting tray 110, and the portion of the side wall 130 under the recess 131 is left with a height preferably higher than the thickness of the display panel 500. Thus, when the display panel 500 is assembled with the frame 100, the side wall 130 may still support the side portion 330 of the elastic pad 300. In other embodiments, however, the side wall 130 may be formed without the recess 131 and still can achieve the purpose to position the elastic pad 300. Furthermore, as FIG. 8B shows, on the portion of the side wall 130 under the recess 131, a lead angle 133 is preferably formed at a location where a top end of the portion of the side wall 130 corresponding to the recess 131 meets the inner surface of the side wall 130. For example, the top corner of the side wall 131 corresponding to the elastic pad 300 can be a rounded corner. Through the design, when the display panel 500 is assembled with the frame 100, the elastic pad 300 may be moved downward along the lead angle 133 smoothly and bent to be in contact with the side wall 130 and the groove 150. When the side wall 130 is not disposed with the recess 131, the lead angle 133 may be applied to the top end of the side wall 130 corresponding to the position of the elastic pad 300.

Figure 9A:
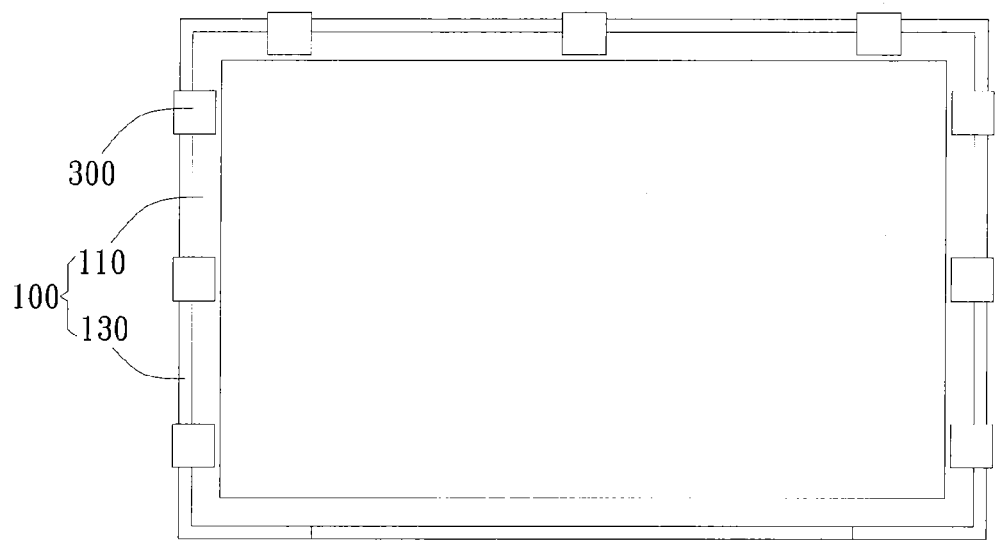
FIG. 9A illustrates a schematic view of an embodiment of the distribution of the elastic pad.
Figure 9B:
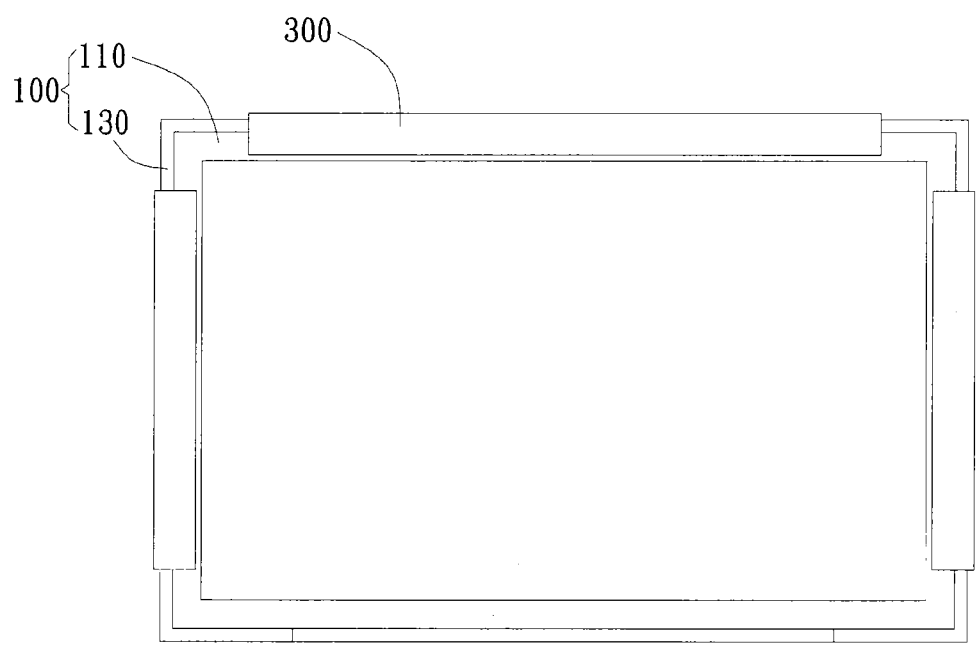
FIG. 9B illustrates a schematic view of another embodiment of the distribution of the elastic pad.

In the embodiment shown in FIG. 9A, the elastic pad 300 is preferably distributed uniformly on two ends and the center of each side of the frame 100. For example, 3 elastic pads are uniformly distributed on one side of the frame 100, but not limited thereto. In other embodiments, however, in the FIG. 9B, the elastic pad 300 may be a bar having a length equal to each side of the frame 100 to increase the force of positioning the display panel 500, but not limited thereto. In addition, by adjusting the width, area, and position of the elastic pad 300, the force of positioning the display panel 500 can be adjusted and the assembly requirements can be met.

Figure 10:
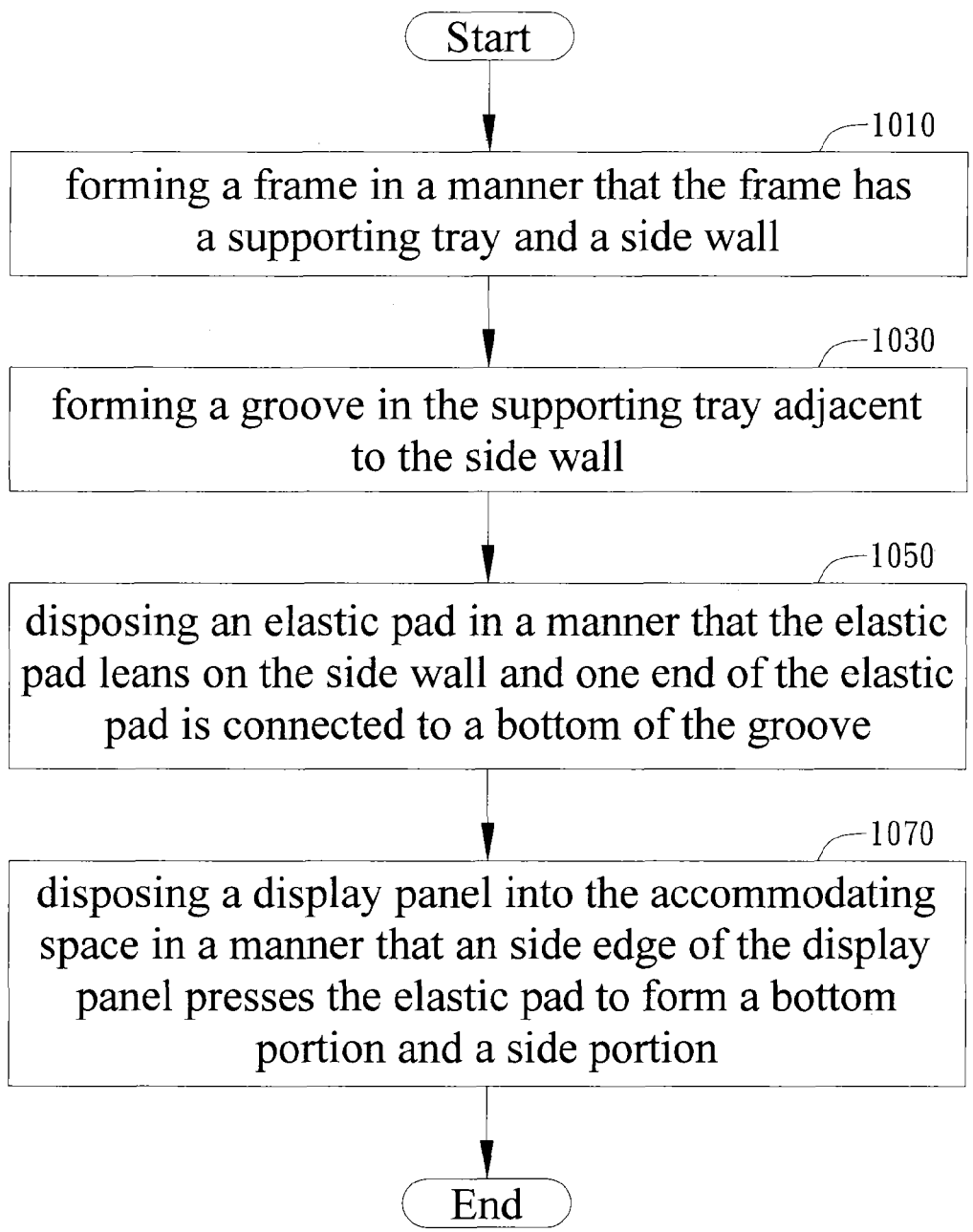
FIG. 10 illustrates a flow chart of a method for manufacturing a display device.

FIG. 10 illustrates a flow chart of a method for manufacturing the display device in accordance with an embodiment of the present invention. Step 1010 includes forming a frame 100 in a manner that the frame 100 has a supporting tray 100 and a side wall 130, and the supporting tray 110 and the side wall 130 together enclose an accommodating space. In an embodiment, the frame 100 is preferably made of thermosetting plastics by injection molding. In other embodiments, however, the frame 100 may be made of different materials and by different processes.

Step 1030 includes forming a groove in the supporting tray 110 adjacent to the side wall 130. In an embodiment, the forming of the groove 150 is to manufacture a mold with a bump corresponding to the groove 150 in advance, and then the groove 150 can be formed adjacent to the side wall 130 simultaneously as the frame 100 is made by injection molding. Moreover, the groove 150 is preferably distributed uniformly on two ends and the center of each side of the frame 100. In other embodiments, however, the groove 150 can be a bar shaped groove having a length equal to each side of the frame 100. Furthermore, the side wall 130 can be selectively formed with a recess 131 corresponding to the groove 150. The top end of the side wall 130 can be selectively formed with a lead angle to facilitate the elastic pad 300 to slide smoothly and to increase the assembly convenience.

Step 1050 includes disposing an elastic pad 300 to lean on the side wall 130 so that one end of the elastic pad 300 is connected to a bottom of the groove 150. The elastic pad 300 preferably leans on the top end of the side wall 130 or can lean on an inner side of the side wall 130. In the embodiment, the bottom end of the bottom portion 310 of the elastic pad 300 is preferably fixed on the bottom of the groove 150 by adhesive. In other embodiments, however, the end of the bottom portion 310 can be fixed to the groove 150 by latch or other suitable fixing means. Furthermore, the edge of the bottom portion 310 can be just in contact with the edge of the groove 150. In an embodiment, the thickness of the elastic pad 300 is preferably greater than the depth of the groove 150. However, in other embodiment, the thickness of the elastic pad 300 can be equal to or smaller than the depth of the groove 150. The width of the elastic pad 300 is preferably equal to the width of the groove 150, but not limited thereto.

Step 1070 includes disposing a display panel 500 in the accommodating space in a manner that a side edge 550 of the display panel 500 presses the elastic pad 300 so that the elastic pad 300 is bent to form the bottom portion 310 and the side portion 330. The bottom portion 310 is pressed into the groove 150 while the side portion 330 is compressed by the side edge 550 of the display panel 500 and attached to an inner surface of the side wall 130. If the thickness of the bottom portion 310 is greater than the depth of the groove 150, the bottom portion 310 can be compressed to a level same as the depth of groove 150. A normal force is generated while the display panel 500 presses the side portion 330, and therefore, a friction is generated between the display panel 500 and the side portion 330. Accordingly, the display panel 500 is not susceptible to move with respect to the frame 100 and the positioning effect is achieved. In addition, the friction coefficient of the bottom portion 310 is greater than that of the supporting tray 110. Thus, the static friction between the bottom portion 310 and the bottom surface of the display panel 500 is greater than that between the supporting tray and the bottom surface of the display panel, such that the display panel 500 can not move easily and the positioning effect is achieved.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

We claim:

1. A display device, comprising:
 a frame having a supporting tray, a protrusion, and a side wall, the side wall upwardly extending from an edge of the supporting tray, and the protrusion upwardly extending from another edge of the supporting tray, wherein the supporting tray, the protrusion, and the side wall together enclose an accommodating space;
 an elastic pad, one end of the elastic pad being supported by a top edge of the side wall and the other end of the elastic pad being attached to an inner surface of the protrusion, and then the elastic pad being bent to form a bottom portion and a side portion, the bottom portion accommodated in the accommodating space while the side portion attached to an inner surface of the side wall, wherein the elastic pad has an elastic modulus higher than that of the side wall; and a display panel disposed in the accommodating space, the supporting tray supporting a bottom surface of the display panel, wherein a side edge of the display panel corresponds to the side wall of the frame and compresses the side portion of the elastic pad.

2. The display device of claim 1, wherein the bottom portion of the elastic pad has a thickness greater than a depth of the groove before the bottom portion is compressed.

3. The display device of claim 2, wherein the bottom portion supports the bottom surface of the display panel, a unit static friction between the bottom portion and the bottom surface of the display panel is greater than that between the supporting tray and the bottom surface of the display panel.

4. The display device of claim 1, wherein the elastic pad has a friction coefficient greater than that of the frame.

5. The display device of claim 1, wherein a positioning protrusion is formed on the side portion corresponding to the side edge of the display panel, the positioning protrusion comes into contact with a top end of the side edge of the display panel.

6. The display device of claim 5, wherein the positioning protrusion is a rib distributed along the top end of the side edge of the display panel.

7. The display device of claim 1, wherein an end of the bottom portion is fixed on a bottom of the groove.

8. The display device of claim 1, wherein an end of the bottom portion comes into contact with an edge of the groove.

9. The display device of claim 1, wherein a recess is formed in the side wall corresponding to the elastic pad, the recess has a width not less than that of the elastic pad.

10. The display device of claim 9, wherein a lead angle is formed at a location where a top end of the recess corresponding to the side wall meets the inner surface of the side wall.

11. The display device of claim 1, wherein a lead angle is formed at a location where the inner surface of the side wall meets the top end of the side wall.

* * * * *